United States Patent
Ma et al.

(10) Patent No.: US 7,955,654 B2
(45) Date of Patent: Jun. 7, 2011

(54) METHOD OF PREPARATION OF A MWCNT/POLYMER COMPOSITE HAVING ELECTROMAGNETIC INTERFERENCE SHIELDING EFFECTIVENESS

(75) Inventors: Chen-Chi Martin Ma, Hsinchu (TW); Siu-Ming Yuen, Hsinchu (TW); Chia-Yi Chuang, Hsinchu (TW); Kuo-Chi Yu, Hsinchu (TW); Sheng Yen Wu, Hsinchu (TW)

(73) Assignee: National Tsing Hua University (TW)

( * ) Notice: Subject to any disclaimer, the term of this patent is extended or adjusted under 35 U.S.C. 154(b) by 419 days.

(21) Appl. No.: 12/081,517

(22) Filed: Apr. 17, 2008

(65) Prior Publication Data
US 2009/0104361 A1  Apr. 23, 2009

(30) Foreign Application Priority Data
Oct. 19, 2007  (TW) .............................. 96139396 A

(51) Int. Cl.
*B05D 3/02*  (2006.01)
(52) U.S. Cl. .................. 427/372.2; 427/384; 427/385.5; 427/393.5
(58) Field of Classification Search ........................ None
See application file for complete search history.

(56) References Cited

U.S. PATENT DOCUMENTS
2008/0057265 A1* 3/2008 Liang et al. .................... 428/114
2010/0065788 A1* 3/2010 Momose et al. ............... 252/511

FOREIGN PATENT DOCUMENTS
WO  WO2007/066649  * 6/2007

OTHER PUBLICATIONS

Yuen et al, Composites Science and Technology, 68, pp. 963-968, available online Aug. 17, 2007.*
Jia et al, Materials Science and Engineering, A271, pp. 395-400, 1999.*
Ma et al, Journal of Polymer Sceince: Part B: Polymer Physics, 43, pp. 345-358, 2005.*
Yang et al, Mater. Res. Soc. Symp. Proc., vol. 858E, pp. HH5.3.1-HH5.3.5, 2005.*
Yuen, Siu-Ming et al, Effect of Processing Method on the Shielding Effectiveness of Electromagnetic interference if MWCNT/PMMA Composites, pp. 1-6, Composites Science and Technology (2007), doi: 10.1016/j.compscitech.2007.08.004.

* cited by examiner

*Primary Examiner* — Erma Cameron
(74) *Attorney, Agent, or Firm* — Bacon & Thomas, PLLC

(57) ABSTRACT

A method of preparing carbon nanotube/polymer composite having electromagnetic interference (EMI) shielding effectiveness is disclosed, which includes: dispersing multi-walled carbon nanotubes (MWCNT) in an organic solvent such as N,N-Dimethylacetamide (DMAc); dissolving monomers such as methyl methacrylate (MMA) and an initiator such as 2,2-azobisisobutyronitrile (AIBN) in the MWCNT dispersion; and polymerizing the monomers in the resulting mixture at an elevated temperature such as 120° C. to form a MWCNT/PMMA composite. The composite is coated onto a PET film, and the coated PET film alone or a stack of multiple coated PET films can be applied as an EMI shielding material.

19 Claims, 2 Drawing Sheets

METHOD OF PREPARATION OF A MWCNT/POLYMER COMPOSITE HAVING ELECTROMAGNETIC INTERFERENCE SHIELDING EFFECTIVENESS

FIELD OF THE INVENTION

The present invention provides a MWCNT/Polymer composite having electromagnetic interference shielding effectiveness and a method of preparation thereof.

BACKGROUND OF THE INVENTION

USP 2007/012900 A1 discloses a particulate conductive filler which comprises a conductive metal coating formed over a coarse carbon-based core such as graphite between 350 and 1000 microns in size. The conductive filler is used in conjunction with a polymer matrix such as an elastomer typified by silicone elastomer to form composite materials for conductive and electromagnetic interference shielding applications.

WO 2007/010517 A1 discloses modified polymers which are prepared by providing a nanotube or nanoparticle suspension, adding a preformed polymer, swelling the preformed polymer in the suspension, and isolating the modified polymer from the suspension. The polymer may be a swellable polymer in the form of polymeric yarns, fibres, fabrics, ribbons or films. The swelling may be carried out using ultrasonic treatment. Carbon nanotubes, magnetic (Fe3O4) and fluorescent (CdTe) nanoparticles suspensions have been utilized to demonstrate the fabrication of new polymer composites. The magnetic polymer composites are useful in electromagnetic interference (EMI) shielding of medical equipment in hospitals, computers and consumer electronics.

USP 2005/127329 A1 discloses a method of reinforcing a polymeric material with nanosize materials, in which materials such as vapor grown carbon nanofibers, carbon nanotubes, layered silicates, nanosize sphered silica, or graphite nanoparticles are combined with a polymer and a solvent to form a substantially homogeneous mixture, followed by removal of the solvent by evaporation or coagulation. Depending on the nanosize materials used, the resulting polymeric nanocomposite material exhibits high electrical and thermal conductivity, enhanced mechanical strength, abrasion resistance, reduced gas permeation, and/or dimensional stability. The polymeric nanocomposite material may be used in electromagnetic interference shielding. The polymer used in this prior art invention is preferably selected from the group consisting of polyurethanes, polyolefins, polyamides, polyimides, epoxy resins, silicone resins, polycarbonate resins, acrylic resins, and aromatic-heterocyclic rigid-rod and ladder polymers.

WO 2004/097853 A1 discloses a conductive carbon nanotube-polymer composite comprising carbon nanotubes and a polymer, wherein the carbon nanotubes primarily reside between coalesced particles of the polymer. The composite is prepared with a suspension of carbon nanotubes that can be stabilized with a stabilizer, such as a water-soluble polymer or surfactant. The nanotube suspension is mixed with a polymer suspension of polymer particles that substantially exclude the nanotubes. The polymer suspension can be stabilized with a stabilizer, such as a water-soluble polymer or surfactant. After mixing the two suspensions, water and any solvent are removed to form a nanotube-polymer composite. As liquid is removed from the nanotube-polymer suspension, the polymer particles coalesce and the nanotubes become trapped and aggregate primarily between the polymer particles, wherein the nanotubes form a conductive network in the polymer composite. Electrical percolation was realized with less than 0.04 wt % single-wall carbon nanotubes in poly(vinyl acetate).

SUMMARY OF THE INVENTION

An objective of the present invention is to provide a method of preparing carbon nanotube/polymer composite having electromagnetic interference (EMI) shielding effectiveness.

In order to accomplish the aforesaid objective a method of preparing carbon nanotube/polymer composite having electromagnetic interference (EMI) shielding effectiveness provided in the present invention comprises the following steps: a) preparing a polymer solution containing 0.5-10 wt % of carbon nanotubes dispersed therein, based on the weight of the polymer; and b) coating the polymer solution containing carbon nanotubes dispersed therein on a substrate and drying the resulting layer coated on the substrate.

Preferably, the method of the present invention further comprises the following step: c) stacking a plurality of the substrates prepared from step b), each of which has the dried layer. More preferably, step c) further comprises applying an adhesive on the substrates prior to said stacking so that the stacked substrates are bonded.

Preferably, the dried layer on the substrate prepared in step b) has a thickness of 0.05 mm to 1.0 mm. More preferably, 2 to 100 sheets of the substrates are stacked in step c).

Preferably, said preparing in step a) comprises dispersing carbon nanotubes in an organic solvent; dissolving monomers and an initiator in the carbon nanotube dispersion; and polymerizing the monomers in the resulting mixture to form said polymer solution containing carbon nanotubes dispersed therein. Said monomers preferably are selected from the group consisting of acrylic acid, methacrylic acid, methyl acrylate, methyl methacrylate, and styrene; or said monomers are a mixture of acrylonitrile, butadiene and styrene. Among them, methyl methacrylate (MMA) is more preferable. Said organic solvent preferably is N,N-Dimethylacetamide (DMAc), said initiator preferably is 2,2-azobisisobutyronitrile (AIBN), and said monomers preferably are polymerized at 120° C.

Alternatively, said preparing in step a) comprises dissolving a polymer in an organic solvent and dispersing carbon nanotubes in the resulting polymer solution to form said polymer solution containing carbon nanotubes dispersed therein. Said polymer preferably is selected from the group consisting of poly(acrylic acid), poly(methacrylic acid), poly (methyl acrylate), poly(methyl methacrylate), soluble polyimide, soluble poly(amide imide), polyamide, polystyrene, soluble polyurethane, unsaturated polyester, poly(ether sulfone), soluble poly(ether imide), poly(vinyl ester), thermoplastic-polyurethane, silicone, and epoxy resin. Among them poly(methyl methacrylate) (PMMA) is more preferable. Said PMMA is preferably prepared by polymerizing methyl methacrylate in a solvent of N,N-Dimethylacetamide and in the presence of an initiator of 2,2-azobisisobutyronitrile at 120° C.

Preferably, the carbon nanotubes are multi-walled carbon nanotubes (MWCNT).

Preferably, the carbon nanotubes are single-wall carbon nanotubes.

Preferably, the carbon nanotubes are double-wall carbon nanotubes.

Preferably, the carbon nanotubes are bamboo-type carbon nanotubes.

Preferably, the carbon nanotubes are spiral-type carbon nanotubes.

Preferably, the carbon nanotubes are $TiO_2$-coated carbon nanotubes.

Preferably, the carbon nanotubes are metal-coated carbon nanotubes.

Preferably, said substrate in step b) is a film of poly(ethylene terephthalate), polyimide, polyethylene, polypropylene, or poly(vinyl chloride).

Preferably, said substrate in step b) is a poly(ethylene terephthalate) (PET) film.

Preferably, said substrate in step b) is a: polypropylene-film.

Preferably, said substrate in step b) is a poly(vinyl chloride) film.

The present invention also provides a method of using a carbon nanotube/polymer composite to provide electromagnetic interference (EMI) shielding, which comprises preparing a carbon nanotube/polymer composite by using the method of the present application as described above; and enclosing an electronic device in the carbon nanotube/polymer composite.

DETAILED DESCRIPTION OF THE INVENTION

Figure 1:
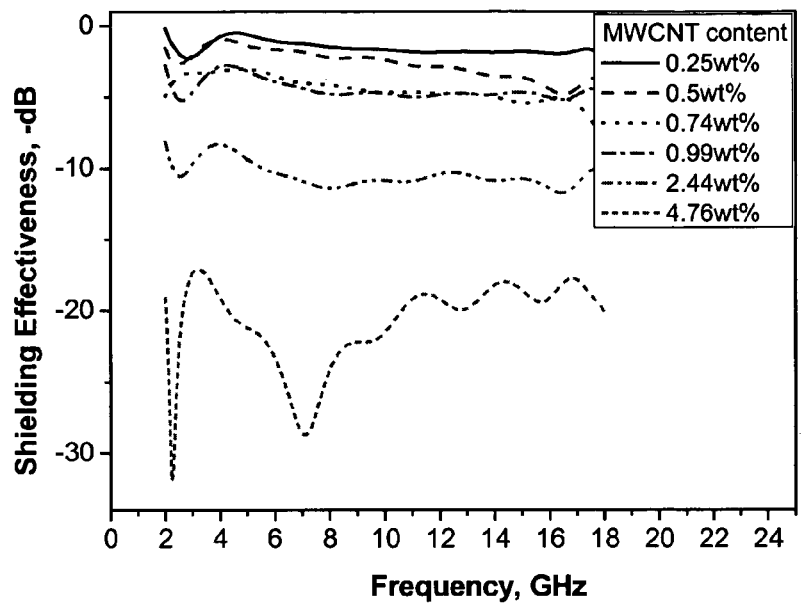
FIG. 1 is a plot showing an effect of MWCNT content on the EMI shielding effectiveness of 1.0 mm MWCNT/PMMA composite sheets prepared in Control Examples 1 to 6.

A carbon nanotube/polymer composite having electromagnetic interference (EMI) shielding effectiveness prepared by a method according to one of the preferred embodiments of the present invention comprises the following steps:
a) Dispersing MWCNTs in DMAc;
b) Adding MMA and AIBN to the MWCNT dispersion prepared in Step (a);
c) Polymerizing MMA at 120° C. to form a solution of MWCNT/PMMA composite;
d) Coating the solution from Step c) on a PET film and drying the solution coated on the PET film; and
e) Stacking a plurality of coated PET films from Step d) and using the stacked PET films as an EMI shielding material.

A carbon nanotube/polymer composite having-electromagnetic interference (EMI) shielding effectiveness prepared by a method according to another preferred embodiment of the present invention comprises the following steps:
A) Dissolving MMA and AIBN in DMAc;
B) Polymerizing MMA at 120° C. to form a solution of PMMA;
C) Adding MWCNTs to the PMMA solution prepared in Step (B) and dispersing MWCNTs in the PMMA solution under ultrasonication;
D) Coating the PMMA solution containing MWCNTs dispersed therein from Step C) on a PET film and drying the solution coated on the PET film; and
E) Stacking a plurality of coated PET films from Step d) and using the stacked PET films as an EMI shielding material.

The present invention will be better understood through the following Examples, which are merely for illustration and not for limiting the scope of the present invention. Materials used in the following Examples and Control Examples were:

Multi-Walled CNT (abbreviated as MWCNT) produced by The CNT Company, Inchon, Korea. This type of CNT was prepared by a CVD process. The CNTs had a purity of 93%, a diameter of 10-50 nm, a length of 1-25 μm, and a specific surface area of 150-250 $m^2g^{-1}$.

Methyl methacrylate (MMA) manufactured by Acros Organics Co., New Jersey, USA.

2,2-azobisisobutyronitrile (AIBN) manufactured by Tokyo Chemical Industry Co., Ltd., Tokyo, Japan.

Control Example 1

2.62 g of MWCNTs were dispersed in 97.5 g of DMAc; 52.5 g of MMA and 0.11 g of AIBN initiator were added into the resulting dispersion; next, the mixture was allowed to undergo polymerization at 120° C., so that a solution of MWCNT/PMMA composite was formed. The MWCNT/PMMA composite solution was used to form a sheet of 20 cm×20 cm×0.1 cm by molding.

Control Examples 2-6

The procedures in Control Example 1 were repeated except that the MWCNT content in the composite was varied as follows:
0.13 g of MWCNT was used in Control Example 2;
0.26 μg of MWCNT was used in Control Example 3;
0.39 g of MWCNT was used in Control Example 4;
0.53 g of MWCNT was used in Control Example 5; and
1.31 g of MWCNT was used in Control Example 6.

Control Example 7

52.5 g of MMA and 0.11 g of AIBN initiator were dissolved in 97.5 g of DMAc; and the solution was allowed to undergo polymerization at 120° C. to form a PMMA solution. 2.62 g of MWCNTs was dispersed in the PMMA solution under ultrasonication. The resulting MWCNT/PMMA composite dispersion was used to form a sheet of 20 cm×20 cm×0.1 cm by molding.

Control Examples 8-12

The procedures in Control Example 7 were repeated except that the MWCNT content in the composite was varied as follows:
0.13 g of MWCNT was used in Control Example 8;
0.26 g of MWCNT was used in Control Example 9;
0.39 g of MWCNT was used in Control Example 10;
0.53 g of MWCNT was used in Control Example 11; and
1.31 g of MWCNT was used in Control Example 12.

Examples 1-10

2.62 g of MWCNTs were dispersed in 97.5 g of DMAc; 52.5 g of MMA and 0.11 g of AIBN initiator were added into the resulting dispersion; next, the mixture was allowed to undergo polymerization at 120° C., so that a solution of MWCNT/PMMA composite was formed. The MWCNT/PMMA composite solution was coated on a PET film, and the resulting coating layer was dried by evaporating the organic solvent therefrom to form a MWCNT/PMMA composite layer having a thickness of 0.1 cm on the PET film. The coating area was 20 cm×20 cm. 10 sheets of the coated PET films were prepared as above. A single sheet of the coated PET film was used as an EMI shielding material, or multiple sheets of the coated PET films were stacked and the resulting stack was used as an EMI shielding material.

Examples 11-20

52.5 g of MMA and 0.11 g of AIBN initiator were dissolved in 97.5 g of DMAc, and the solution was allowed to undergo polymerization at 120° C. to form a PMMA solution. 2.62 g of MWCNTs was dispersed in the PMMA solution under ultrasonication. The resulting MWCNT/PMMA composite dispersion was coated on a PET film, and the resulting coating layer was dried by evaporating the organic solvent therefrom to form a MWCNT/PMMA composite layer having a thickness of 0.1 cm on the PET film. The coating area was 20 cm×20 cm. 10 sheets of the coated PET films were prepared as above. A single sheet of the coated PET film was used as an EMI shielding material, or multiple sheets of the coated PET films were stacked and the resulting stack was used as an EMI shielding material.

EMI shielding effectiveness (2-18 GHz) was measured by using a HP 8722ES Vector Network Analyzer manufactured by Damaskos, Inc., Concordville, Pa., USA.

Results:

Table 1 shows the EMI shielding effectiveness at 15 GHz of the MWCNT/PMMA composite sheets prepared in Control Examples 1 to 6. Table 2 shows the EMI shielding effectiveness at 15 GHz of the MWCNT/PMMA composite sheets prepared in Control Examples 7 to 12.

The results of the EMI shielding effectiveness at 15 GHz for the coated PET film and the multiple-coated-PET film stacks prepared in Examples 1-10 and Examples 11-20 are shown in Table 3 and Table 4, respectively.

TABLE 1

|  | MWCNT content, wt % | EMI shielding effectiveness at 15 GHz, dB |
|---|---|---|
| Control Ex. 1 | 4.76 | 18.56 |
| Control Ex. 2 | 0.25 | 1.82 |
| Control Ex. 3 | 0.5 | 3.63 |
| Control Ex. 4 | 0.74 | 5.40 |
| Control Ex. 5 | 0.99 | 4.65 |
| Control Ex. 6 | 2.44 | 10.70 |

TABLE 2

|  | MWCNT content, wt % | EMI shielding effectiveness at 15 GHz, dB |
|---|---|---|
| Control Ex. 7 | 4.76 | 20.29 |
| Control Ex. 8 | 0.25 | 1.32 |
| Control Ex. 9 | 0.5 | 1.98 |
| Control Ex. 10 | 0.74 | 3.17 |
| Control Ex. 11 | 0.99 | 3.66 |
| Control Ex. 12 | 2.44 | 10.87 |

TABLE 3

|  | Number of films stacked | EMI shielding effectiveness at 15 GHz, dB |
|---|---|---|
| Example 1 | 1 | 5.85 |
| Example 2 | 2 | 8.84 |
| Example 3 | 3 | 12.18 |
| Example 4 | 4 | 15.09 |
| Example 5 | 5 | 17.03 |
| Example 6 | 6 | 17.91 |
| Example 7 | 7 | 21.91 |
| Example 8 | 8 | 25.41 |
| Example 9 | 9 | 30.42 |
| Example 10 | 10 | 41.98 |

TABLE 4

|  | Number of films stacked | EMI shielding effectiveness at 15 GHz, dB |
|---|---|---|
| Example 11 | 1 | 4.11 |
| Example 12 | 2 | 7.12 |
| Example 13 | 3 | 8.97 |
| Example 14 | 4 | 11.68 |
| Example 15 | 5 | 15.15 |
| Example 16 | 6 | 20.19 |
| Example 17 | 7 | 22.95 |
| Example 18 | 8 | 27.28 |
| Example 19 | 9 | 36.23 |
| Example 20 | 10 | 45.36 |

Figure 2:
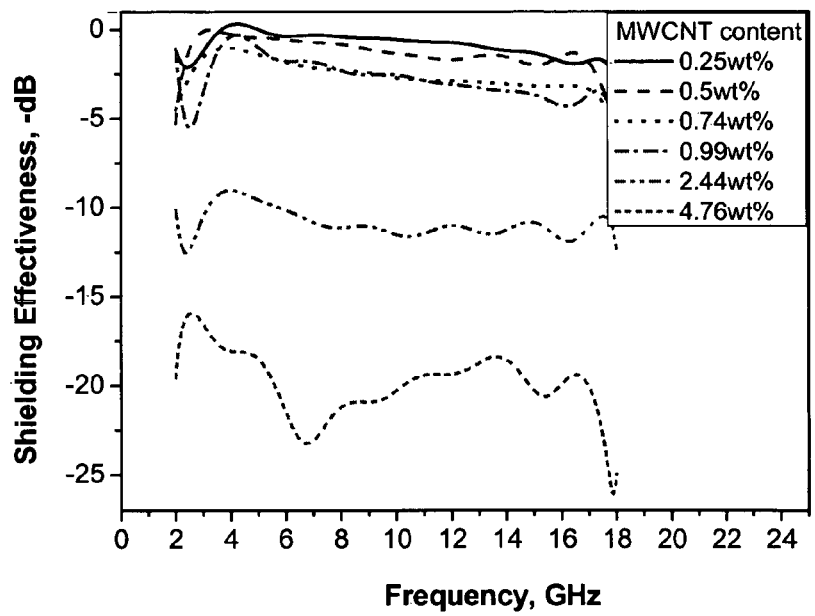
FIG. 2 is a plot showing an effect of MWCNT content on the EMI shielding effectiveness of 1.0 mm MWCNT/PMMA composite sheets prepared in Control Examples 7 to 12.
Figure 3:
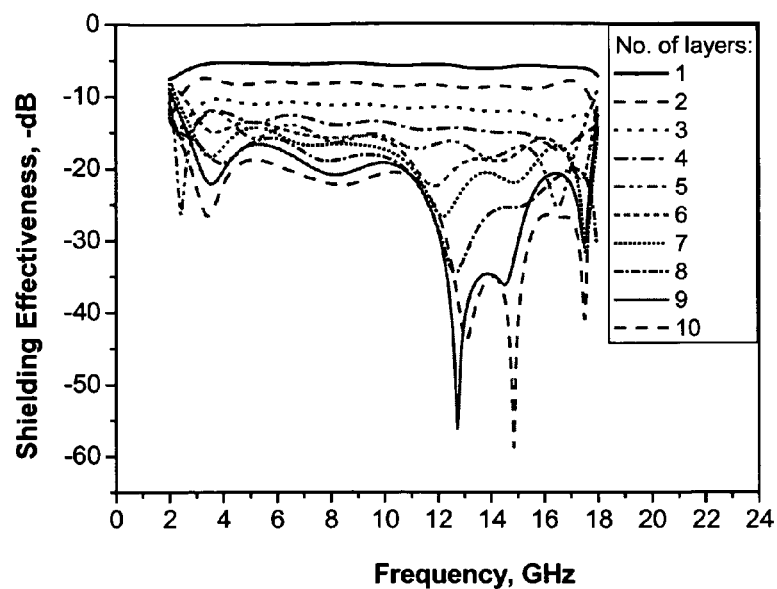
FIG. 3 is a plot showing an effect of number of layers of 0.1 mm MWCNT/PMMA coated PET film on the EMI shielding effectiveness prepared in Examples 1 to 10 of the present invention.
Figure 4:
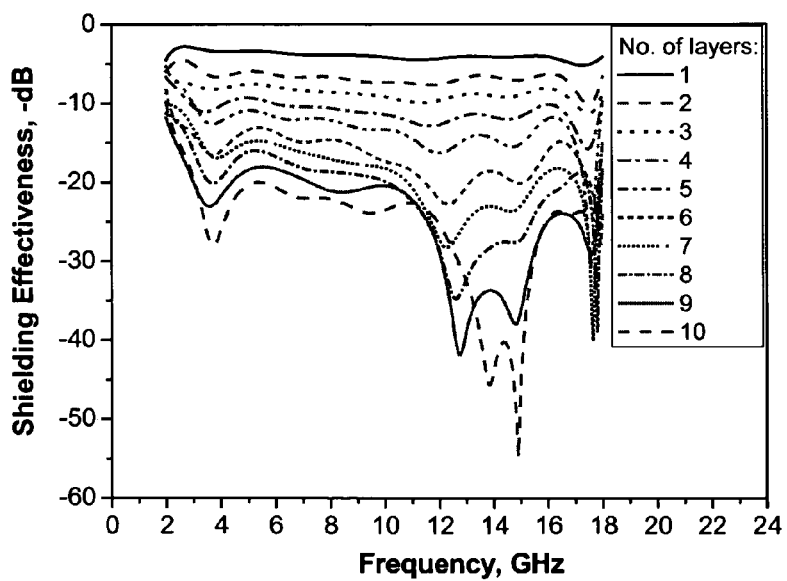
FIG. 4 is a plot showing an effect of number of layers of 0.1 mm MWCNT/PMMA coated PET film on the EMI shielding effectiveness prepared in Examples 11 to 20 of the present invention.

The data shown in Tables 1 to 4 and FIGS. 1 to 4 indicate that the coated PET film or the stacks of multiple sheets of the coated PET films prepared in Examples 1-20 of the present invention have better EMI shielding effectiveness in comparison with the MWCNT/PMMA sheets having the same MWCNT contents prepared in Control Examples 1-20. For examples 41.98 dB of Example 10 (10-sheet stack) shown in Table 3 is significantly higher than 18.56 dB of Control Example 1 (MWCNT content 4.76 wt %) shown in Table 1; 17.03 dB of Example 5 (5-sheet stack) shown in Table 3 is significantly higher than 10.70 dB of Control Example 6 (MWCNT content 2.44 wt %) shown in Table 1.

The EMI shielding effectiveness between 2-18 GHz for the EMI shielding materials prepared in Control Examples 1-6, Control Examples 7-12, Examples 1-10 and Examples 11-20 are shown in FIGS. 1 to 4, respectively. It can be seen from FIGS. 1 and 3 or FIGS. 2 and 4 that the coated PET film or the stacks of multiple sheets of the coated PET films prepared in Examples 1-20 of the present invention have better EMI shielding effectiveness in comparison with the MWCNT/PMMA sheets having the same MWCNT contents prepared in Control Examples 1-20.

The invention claimed is:

1. A method of preparing carbon nanotube/polymer composite having electromagnetic interference (EMI) shielding effectiveness, which comprises the following steps: a) preparing a polymer solution containing 0.5-10 wt % of carbon nanotubes dispersed therein, based on the weight of the polymer; b) coating the polymer solution containing carbon nanotubes dispersed therein on a substrate and drying the resulting layer coated on the substrate; and c) stacking a plurality of the substrates prepared from step b), each of which has the dried layer, wherein said preparing in step a) comprises dispersing carbon nanotubes in an organic solvent; dissolving monomers and an initiator in the carbon nanotube dispersion; and polymerizing the monomers in the resulting mixture to form said polymer solution containing carbon nanotubes dispersed therein.

2. The method as claimed in claim 1, wherein step c) further comprises applying an adhesive on the substrates prior to said stacking so that the stacked substrates are bonded.

3. The method as claimed in claim 1, wherein the dried layer on the substrate prepared in step b) has a thickness of 0.05 mm to 1.0 mm.

4. The method as claimed in claim 1, wherein the dried layer on the substrate prepared in step b) has a thickness of 0.05 mm to 1.0 mm, and 2 to 100 sheets of the substrates are stacked in step c).

5. The method as claimed in claim 1, wherein the carbon nanotubes are multi-walled carbon nanotubes.

6. The method as claimed in claim 1, wherein the carbon nanotubes are single-wall carbon nanotubes.

7. The method as claimed in claim 1, wherein the carbon nanotubes are double-wall carbon nanotubes.

8. The method as claimed in claim 1, wherein the carbon nanotubes are bamboo-type carbon nanotubes.

9. The method as claimed in claim 1, wherein the carbon nanotubes are spiral-type carbon nanotubes.

10. The method as claimed in claim 1, wherein the carbon nanotubes are $TiO_2$-coated carbon nanotubes.

11. The method as claimed in claim 1, wherein the carbon nanotubes are metal-coated carbon nanotubes.

12. The method as claimed in claim 1, wherein said monomers are selected from the group consisting of acrylic acid, methacrylic acid, methyl acrylate, methyl methacrylate, and styrene; or said monomers are a mixture of acrylonitrile, butadiene and styrene.

13. The method as claimed in claim 12, wherein said monomers are methyl methacrylate.

14. The method as claimed in claim 13, wherein said organic solvent is N,N-Dimethylacetamide, said initiator is 2,2-azobisisobutyronitrile, and said monomers are polymerized at 120° C.

15. The method as claimed in claim 1, wherein said substrate in step b) is a film of polyethylene terephthalate), polyimide, polyethylene, polypropylene, or poly(vinyl chloride).

16. The method as claimed in claim 15, wherein said substrate in step b) is a poly(ethylene terephthalate) film.

17. The method as claimed in claim 15, wherein said substrate in step b) is a polypropylene film.

18. The method as claimed in claim 15, wherein said substrate in step b) is a poly(vinyl chloride) film.

19. A method of using a carbon nanotube/polymer composite to provide electromagnetic interference (EMI) shielding comprising preparing a carbon nanotube/polymer composite by using the method as defined in claim 1; and enclosing an electronic device in the carbon nanotube/polymer composite.

* * * * *